(12) United States Patent
Park (10) Patent No.: US 8,305,837 B2
(45) Date of Patent: Nov. 6, 2012

(54) SEMICONDUCTOR MEMORY DEVICE FOR GUARANTEEING RELIABILITY OF DATA TRANSMISSION AND SEMICONDUCTOR SYSTEM INCLUDING THE SAME

(75) Inventor: Mun-Phil Park, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 13/243,590

(22) Filed: Sep. 23, 2011

(65) Prior Publication Data

US 2012/0014205 A1   Jan. 19, 2012

Related U.S. Application Data

(62) Division of application No. 12/494,669, filed on Jun. 30, 2009, now Pat. No. 8,050,136.

(30) Foreign Application Priority Data

Jun. 4, 2009 (KR) .................. 10-2009-0049391

(51) Int. Cl.
*G11C 8/00* (2006.01)
(52) U.S. Cl. ........... 365/233.11; 365/233.1; 365/233.13; 365/193
(58) Field of Classification Search ............... 365/233.1, 365/233.11, 233.13, 193
See application file for complete search history.

(56) References Cited

U.S. PATENT DOCUMENTS

| | | | | |
|---|---|---|---|---|
| 7,272,055 | B2 * | 9/2007 | Kishimoto et al. | 365/194 |
| 7,307,461 | B2 * | 12/2007 | Nguyen et al. | 327/172 |
| 7,590,211 | B1 * | 9/2009 | Burney | 375/376 |
| 7,834,664 | B2 * | 11/2010 | Yoon et al. | 327/3 |
| 7,859,939 | B2 * | 12/2010 | Joo et al. | 365/233.1 |
| 7,869,286 | B2 * | 1/2011 | Park et al. | 365/193 |
| 7,889,594 | B2 * | 2/2011 | Yoon et al. | 365/233.1 |
| 7,889,595 | B2 * | 2/2011 | Park | 365/233.1 |
| 8,130,890 | B2 * | 3/2012 | Kim et al. | 375/360 |
| 8,144,542 | B2 | 3/2012 | Na | |

OTHER PUBLICATIONS

Notice of Allowance issued from the U.S. Patent and Trademark Office (USPTO) on Jun. 12, 2012 in U.S. Appl. No. 13/243,697.

* cited by examiner

*Primary Examiner* — VanThu Nguyen
(74) *Attorney, Agent, or Firm* — IP & T Group LLP (57) ABSTRACT

A semiconductor device includes a system clock input unit configured to receive a system clock for synchronizing input times of an address signal and a command signal from a memory controller, a data clock input unit configured to receive first and second data clocks for synchronizing an input/output time of a data signal from the memory controller, wherein a phase of the second data clock is shifted according to a training information signal, and the second data clock having the shifted phase is inputted to the data clock input unit, and a phase detection unit configured to detect a logic level of the second data clock based on an edge of the first data clock, and generate the training information signal to transmit the generated signal to the memory controller according to the detected logic level.

7 Claims, 5 Drawing Sheets

SEMICONDUCTOR MEMORY DEVICE FOR GUARANTEEING RELIABILITY OF DATA TRANSMISSION AND SEMICONDUCTOR SYSTEM INCLUDING THE SAME

CROSS-REFERENCE TO RELATED APPLICATIONS

This application is a division of U.S. patent application Ser. No. 12/494,669 filed on Jun. 30, 2009, now U.S. Pat. No. 8,050,136 which claims priority of Korean patent application No. 10-2009-0049391 filed on Jun. 4, 2009. The disclosure of each of the foregoing applications is incorporated herein by reference in its entirety.

BACKGROUND OF THE INVENTION

The present invention relates to a semiconductor design technology, and particularly, to a semiconductor memory device which operates at high speed. More particularly, the present invention relates to a device and method, which perform crossing-point training (i.e., vix training) between data clocks that are inputted as differential signals, in a high-speed semiconductor memory device.

In a system including a plurality of semiconductor memory devices, a semiconductor memory device stores data. When a data processing device, for example, a memory controller unit (MCU), requests data, the semiconductor memory device outputs data corresponding to an address which is inputted from the data-requesting device or stores data, which are provided from the data-requesting device, in a location corresponding to the address.

As such, a recently developed high-speed memory device was designed to input/output two bits of data at the rising edge and falling edge of an external system clock and to input/output two bits of data at a falling edge and the next rising edge. That is, the high-speed memory device is designed to input/output four bits of data during one cycle of a system clock.

However, because the system clock is represented only in two logic states, i.e., a logic high level and a logic low level, the high-speed memory device requires a data clock with a frequency that is two times faster than that of the system clock for inputting/outputting four bits of data during one cycle. That is, a dedicated clock is required for inputting/outputting data.

Accordingly, a high-speed semiconductor memory device uses a system clock as a reference clock when transmitting/receiving an address and a command. When inputting/outputting data, by using a data clock as the reference clock, the high-speed semiconductor memory device controls the data clock to have a frequency two times faster than that of the system clock.

That is, the high-speed semiconductor memory device allows two cycles of the data clock to be achieved during one cycle of the system clock, and allows the input/output of data to occur at the rising edge and falling edge of the data clock, thereby enabling four bits of data to be inputted/outputted during one cycle of the system clock.

Unlike a typical Double Data Rate (DDR) synchronous memory device that uses one system clock as a reference clock for performing a read/writing operation, the high-speed semiconductor memory device transfers/receives data by using two clocks having different frequencies for performing a read/writing operation.

As described above, a data clock has a relatively high frequency that is two times higher than the frequency of a system clock. Because the data clock thus has a relatively high frequency, the phase of the data clock may be highly distorted by noise generated at the transmission stage of the data clock. In addressing this, when transmitting a data clock, the high-speed semiconductor memory device uses a method that divides the data clock into two out-of-phase data clocks and transmits the data clock differentially.

By transmitting the data clock differentially, much noise-induced distortion in the data clock has been resolved to some degree. However, a method of transmitting the data clock differentially transmits two out-of-phase data clocks simultaneously through different transmission lines, and thus the two transmitted clocks may not have opposite phases with respect to each other as desired. That is, due to the minute resistance difference between transmission lines through which the respective data clocks are transmitted or peripheral environments, two data clocks may adopt different phase shifts while being transmitted. Accordingly, although the two data clocks may have opposite phases with respect to each other at the point when transmission is begun from an MCU, they may not maintain the opposite phases at the arrival point when the two data clocks arrive at a semiconductor memory device at the end of the transmission.

SUMMARY OF THE INVENTION

An embodiment of the present invention is directed to providing a device and method which can perform crossing-point training (i.e., vix training) between data clocks that are inputted differentially, in a high-speed semiconductor memory device.

In accordance with an aspect of the present invention, there is provided a semiconductor memory device. The semiconductor memory device includes a system clock input unit configured to receive a system clock for synchronizing input times of an address signal and a command signal from a memory controller; a data clock input unit configured to receive first and second data clocks for synchronizing an input/output time of a data signal from the memory controller, wherein the second data clock as received by the data clock input unit is intended to be an inverse of the first data clock, a phase of the second data clock is shifted according to a training information signal, and the second data clock having the shifted phase is inputted to the data clock input unit; and a phase detection unit configured to detect a logic level of the second data clock based on an edge of the first data clock, and generate the training information signal to transmit the generated signal to the memory controller according to the detected logic level.

In accordance with another aspect of the present invention, there is provided a semiconductor memory device. The semiconductor memory device includes a system clock input unit configured to receive a system clock for synchronizing input times of an address signal and a command signal from a memory controller; a data clock input unit configured to receive first and second data clocks for synchronizing an input/output time of a data signal from the memory controller, wherein the second data clock as received by the data clock input unit is intended to be an inverse of the first data clock, a phase of the second data clock is shifted according to a data window section length rate of a training information data, and the second data clock having the shifted phase is inputted to the data clock input unit; and a training information data transmission unit configured to determine each data window section of a predetermined pattern data for each reference edge of the first and second data clocks, and transmit the pattern data as the training information data to the memory controller.

In accordance with another aspect of the present invention, there is provided a semiconductor system. The semiconductor system includes a memory controller configured to generate and output a system clock corresponding to an address signal and a command signal, and first and second data clocks corresponding to a data signal, wherein the second data clock as received by the data clock input unit is intended to be an inverse of the first data clock, the memory controller shifts a phase of the second data clock to generate the second data clock having the shifted phase according to a training information signal; and a semiconductor memory device configured to receive the address signal and the command signal based on the system clock and input/output the data signal based on the first and second data clocks to perform a predetermined internal operation, detect a logic level of the second data clock based on a phase of the first data clock, and generate and output the training information signal according to the detected logic level at a training operation mode.

In accordance with another aspect of the present invention, there is provided a semiconductor system. The semiconductor system includes a memory controller configured to generate and output a system clock corresponding to an address signal and a command signal, and first and second data clocks corresponding to a data signal, wherein the second data clock as received by the data clock input unit is intended to be an inverse of the first data clock, the memory controller shifts a phase of the second data clock to generate the second data clock having the shifted phase according to a data window section length rate of a training information data; and a semiconductor memory device configured to receive the address signal and the command signal based on the system clock and input/output the data signal based on the first and second data clocks to perform a predetermined internal operation, determine each data window section of a predetermined pattern data for each reference edge of the first and second data clocks to output the pattern data as the training information data.

DESCRIPTION OF SPECIFIC EMBODIMENTS

Other objects and advantages of the present invention can be understood by the following description, and become apparent with reference to the embodiments of the present invention. The present invention may, however, be embodied in different forms and should not be construed as limited to the embodiments set forth herein. Rather, these embodiments are provided to be thorough and complete, and to enable the full scope of the present invention to those skilled in the art.

First Embodiment

Figure 1:
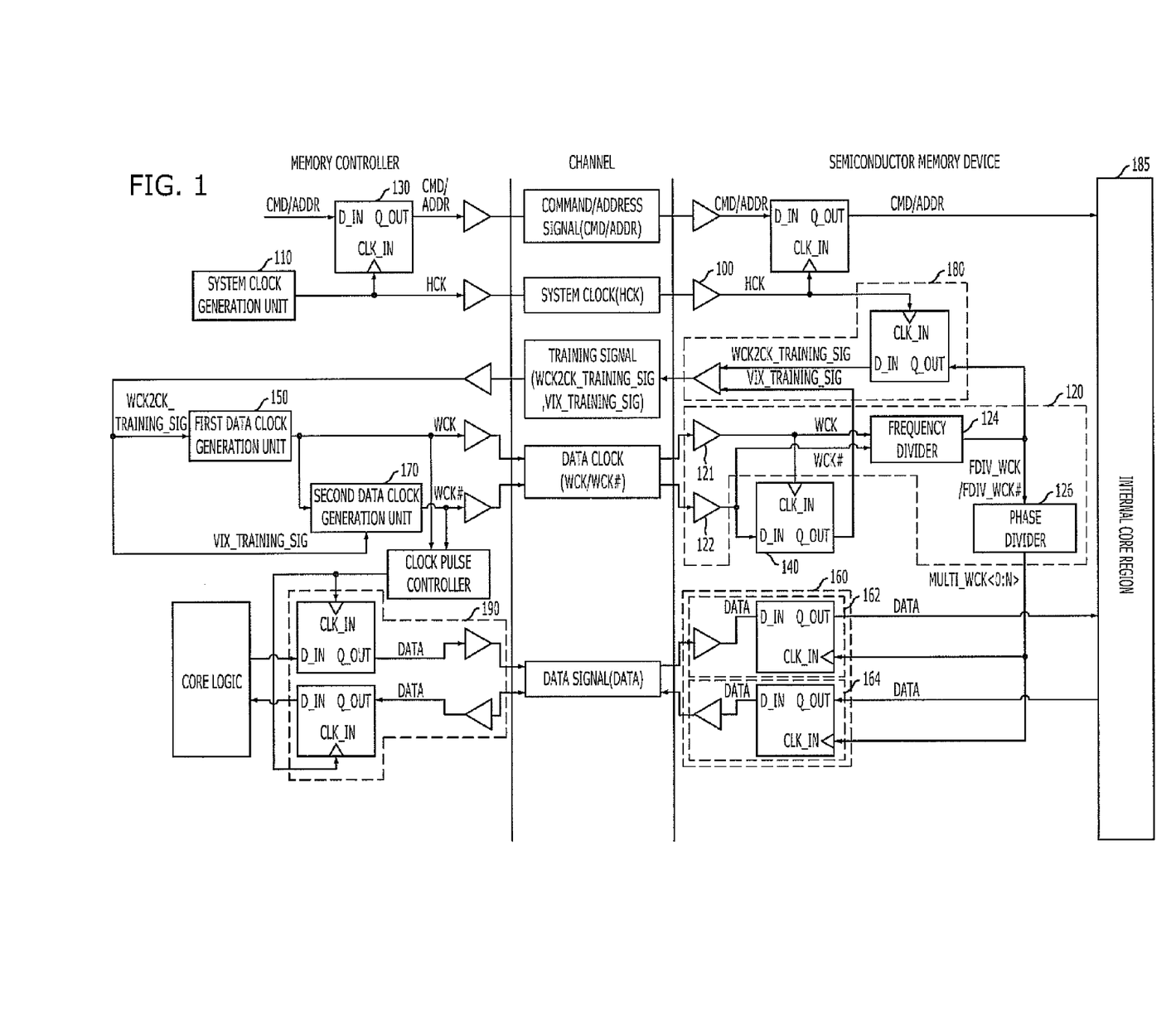
FIG. 1 is a block diagram illustrating a semiconductor system in accordance with a first embodiment of the present invention.

FIG. 1 is a block diagram illustrating a semiconductor system in accordance with a first embodiment of the present invention.

Referring to FIG. 1, a semiconductor system in accordance with a first embodiment of the present invention includes a memory controller and a semiconductor memory device. The memory controller generates and outputs a system clock HCK (which corresponds to an address signal ADDR and a command signal CMD) and first and second data clocks WCK and WCK# which correspond to a data signal DATA, wherein the second data clock WCK# as received by the data clock input unit is intended to be an inverse of the first data clock WCK, and the memory controller shifts the phase of the second data clock WCK# to generate the second data clock WCK# having the shifted phase according to a training information signal VIX_TRAINING_SIG. By receiving the address signal ADDR and the command signal CMD based on the system clock HCK and inputting/outputting the data signal DATA based on the first and second data clocks WCK and WCK#, the semiconductor memory device performs a predetermined internal operation. The semiconductor memory device detects the logic level of the second data clock WCK# based on the phase of the first data clock WCK, and generates and outputs the training information signal VIX_TRAINING_SIG according to the detected logic level at a training operation mode.

The memory controller includes a system clock generation unit 110, an address/command signal output unit 130, a first data clock generation unit 150, a second data clock generation unit 170, and a data signal input/output unit 190. The system clock generation unit 110 generates the system clock HCK. The address/command signal output unit 130 outputs the address signal ADDR and the command signal CMD based on the system clock HCK. The first data clock generation unit 150 generates the first data clock WCK having a phase which is shifted according to a WCK2CK training information signal WCK2CK_TRAINING_SIG. The second data clock generation unit 170 shifts the phase of a clock, in which the phase of the first data clock WCK is inverted, to output the phase-shifted clock as the second data clock WCK# according to the training information signal VIX_TRAINING_SIG. The data signal input/output unit 190 inputs/outputs the data signal DATA based on the first and second data clocks WCK and WCK#.

The semiconductor memory device includes a system clock input unit 100, a data clock input unit 120, and a phase detection unit 140. The system clock input unit 100 receives the system clock HCK for synchronizing the input times of the address signal ADDR and the command signal CMD from the memory controller. The data clock input unit 120 receives the first and second data clocks WCK and WCK# for synchronizing the input/output time of the data signal DATA from the memory controller, wherein the second data clock WCK# as received by the data clock input unit is intended to be an inverse of the first data clock WCK, and the phase of the received second data clock WCK# is shifted according to a training information signal VIX_TRAINING_SIG. The phase detection unit 140 detects the logic level of the second data clock WCK# based on the edge of the first data clock WCK, and generates the training information signal VIX_TRAINING_SIG to transmit the generated signal to the memory controller according to the detected logic level.

Moreover, among the elements of the semiconductor memory device, the data clock input unit 120 includes data clock input buffers 121 and 122, a frequency divider 124, and a phase divider 126. The data clock input buffers 121 and 122 receive and buffer the first and second data clocks WCK and WCK#, respectively. The frequency divider 124 divides the frequencies of the first and second data clocks WCK and WCK# that are outputted from the data clock input buffers 121 and 122 to output clocks FDIV_WCK and FDIV_WCK# having the same frequency as that of the system clock HCK. The phase divider 126 divides the phases of the clocks FDIV_WCK and FDIV_WCK# that are outputted from the frequency divider 124 to generate a plurality of multi system clocks MULTI_WCK <0:N> having a predetermined phase difference.

The semiconductor memory device further includes a WCK2CK phase detection unit 180. The WCK2CK phase detection unit 180 detects the logic levels of the clocks FDIV_WCK and FDIV_WCK# that are outputted from the frequency divider 124 of the data clock input unit 120 based on the edge of the system clock HCK, generates the WCK2CK training information signal WCK2CK_TRAINING_SIG according to the detected logic levels, and transmits the generated signal to the memory controller.

Moreover, the semiconductor memory device further includes a data input/output buffer unit 160. The data input/output buffer unit 160 aligns the data signal DATA based on the multi system clocks MULTI_WCK <0:N> and receives/outputs the data signal DATA from/to the memory controller.

The data input/output buffer unit 160 includes a data input buffer 162 and a data output buffer 164. The data input buffer 162 aligns the data signal DATA that is inputted from the memory controller to the semiconductor memory device based on the multi system clocks MULTI_WCK <0:N> and transmits the aligned signal to an internal core region 185. The data output buffer 164 aligns the data signal DATA that is outputted from the internal core region 185 based on the multi system clocks MULTI_WCK <0:N> and transmits the aligned signal to the memory controller.

Additionally, an operation that aligns the data signal DATA based on the multi system clocks MULTI_WCK <0:N> to transmit the aligned signal is a known operation and can be easily understood without further details being provided. Thus, description of such an operation is unnecessary and, therefore, is omitted.

The following description will be made on the operation of the semiconductor system in accordance with the first embodiment of the present invention, based on the above-described configuration.

First, the frequencies of the first and second data clocks WCK and WCK#, which are transferred from the memory controller to the semiconductor memory device, are higher than the frequency of the system clock HCK. Moreover, the frequency of the data signal DATA, which is inputted/outputted to/from the memory controller and the semiconductor memory device, is higher than the frequencies of the first and second data clocks WCK and WCK#.

For example, when the frequency of the system clock HCK is 1 GHz, the frequencies of the first and second data clocks WCK and WCK# are 2 GHz that is two times higher than the frequency of the system clock HCK, and the frequency of the data signal DATA is 4 GHz that is two times higher than the frequencies of the first and second data clocks WCK and WCK#.

Figure 3A:
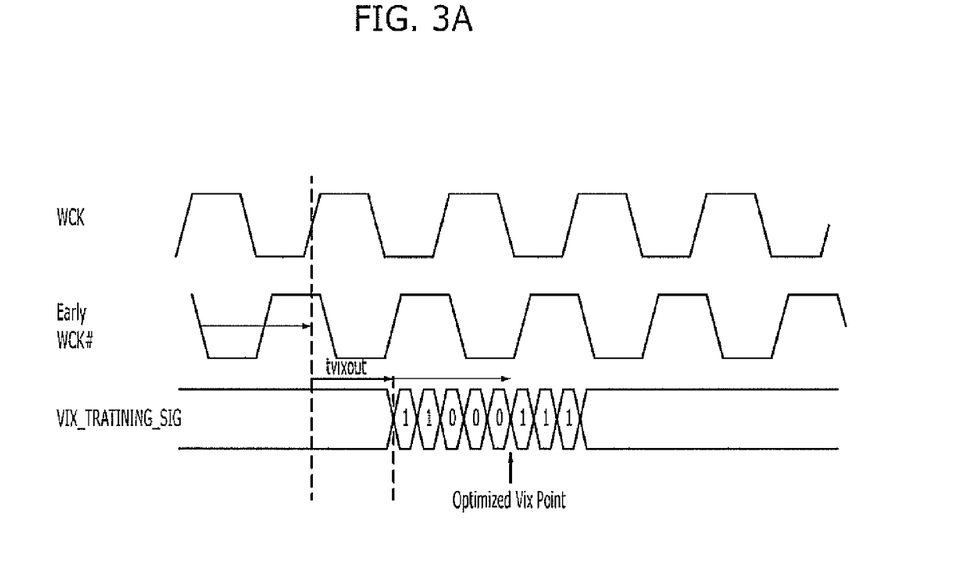
FIG. 3A is a timing diagram illustrating a case where the phase of a second data clock leads that of a first data clock in the operation of the semiconductor system of FIG. 1.

When the logic level of the second data clock WCK# is a logic low level at the reference edge of the first data clock WCK, as shown in FIG. 3A, the phase detection unit 140 of the semiconductor memory device determines that the phase of the second data clock WCK# leads the phase of the first data clock WCK. In the foregoing manner, because the phase of the second data clock WCK# leads the phase of the first data clock WCK, the phase of the second data clock WCK# should be delayed. At this point, since the first and second data clocks WCK and WCK# are generated in the memory controller, the semiconductor memory device transmits the training information signal VIX_TRAINING_SIG having a logic high level to the memory controller.

In the foregoing manner, when the training information signal VIX_TRAINING_SIG having a logic high level is transmitted to the memory controller, the second data clock generation unit 170 of the memory controller delays the phase of the second data clock WCK# to generate the second data clock WCK# having the delayed phase.

In addition, the first and second data clocks WCK and WCK# are signals intended to be inverse of each other in phase. The first data clock generation unit 150 generates the first data clock WCK, and inverts the phase of the first data clock WCK to generate the second data clock WCK#. In delaying the phase of the second data clock WCK#, therefore, the second data clock generation unit 170 outputs a clock having a phase, which lags behind the phase of a clock in which the phase of the first data clock WCK is inverted, as the second data clock WCK# in response to the training information signal VIX_TRAINING_SIG having a logic high level.

Figure 3B:
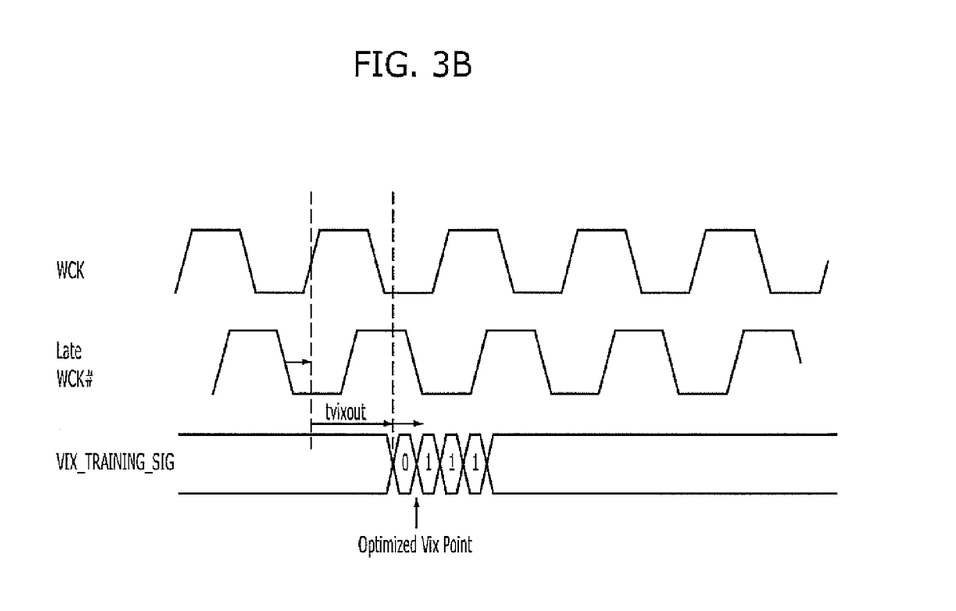
FIG. 3B is a timing diagram illustrating a case where the phase of a second data clock lags behind that of a first data clock in the operation of the semiconductor system of FIG. 1.

When the logic level of the second data clock WCK# is a logic high level at the reference edge of the first data clock WCK, as shown in FIG. 3B, the phase detection unit 140 of the semiconductor memory device determines that the phase of the second data clock WCK# lags behind the phase of the first data clock WCK. In the foregoing manner, because the phase of the second data clock WCK# lags behind the phase of the first data clock WCK, the phase of the second data clock WCK# should be advanced. At this point, since the first and second data clocks WCK and WCK# are generated in the memory controller, the semiconductor memory device transmits the training information signal VIX_TRAINING_SIG having a logic low level to the memory controller.

In the foregoing manner, when the training information signal VIX_TRAINING_SIG having a logic high level is transmitted to the memory controller, the second data clock generation unit 170 of the memory controller advances the phase of the second data clock WCK# to generate the second data clock WCK# having the advanced phase.

In addition, the first and second data clocks WCK and WCK# are signals intended to be inverse signals of each other in phase. The first data clock generation unit 150 generates the first data clock WCK, and inverts the phase of the first data clock WCK to generate the second data clock WCK#. For advancing the phase of the second data clock WCK#, therefore, the second data clock generation unit 170 outputs a clock having a phase, which leads the phase of a clock, in which the phase of the first data clock WCK is inverted, as the second data clock WCK# in response to the training information signal VIX_TRAINING_SIG having a logic high level.

As described above, when the phase detection unit 140 of the semiconductor memory device detects the phase difference between the first and second data clocks WCK and WCK# to determine the logic level of the training information signal VIX_TRAINING_SIG, the second data clock generation unit 170 of the memory controller among the elements of the semiconductor system shifts the phase of the second data clock WCK# to generate the second data clock WCK# having the shifted phase. Accordingly, the first and second data clocks WCK and WCK# as received by the second data clock generation unit 170 are controlled to have opposite phases with respect to each other.

In the first embodiment of the present invention, because the training information signal VIX_TRAINING_SIG may be composed of one bit, it has a logic high level or a logic low level. While this is an exemplary embodiment, the training information signal VIX_TRAINING_SIG may also be composed of a plurality of bits. That is, among the elements of the semiconductor system, the phase detection unit 140 of the semiconductor memory device and the second data clock generation unit 170 of the memory controller may operate as follows.

First, when the logic level of the second data clock WCK# is a logic low level at the reference edge of the first data clock WCK, as shown in FIG. 3A, the phase detection unit 140 of the semiconductor memory device determines that the phase of the second data clock WCK# leads the phase of the first data clock WCK. In the foregoing manner, because the phase of the second data clock WCK# leads the phase of the first data clock WCK, the phase of the second data clock WCK# should be delayed. At this point, since the first and second data clocks WCK and WCK# are generated in the memory controller, the semiconductor memory device increases the value of the training information signal VIX_TRAINING_SIG to transmit the training information signal VIX_TRAINING_SIG having the increased value to the memory controller.

In the foregoing manner, when the training information signal VIX_TRAINING_SIG having the increased value is transmitted to the memory controller, the second data clock generation unit 170 of the memory controller delays the phase of the second data clock WCK# by the increment of the value of the training information signal VIX_TRAINING_SIG to generate the second data clock WCK# having the delayed phase.

When the logic level of the second data clock WCK# is a logic high level at the reference edge of the first data clock WCK, as shown in FIG. 3B, the phase detection unit 140 of the semiconductor memory device determines that the phase of the second data clock WCK# lags behind the phase of the first data clock WCK. In the foregoing manner, because the phase of the second data clock WCK# lags behind the phase of the first data clock WCK, the phase of the second data clock WCK# should be advanced. At this point, since the first and second data clocks WCK and WCK# are generated in the memory controller, the semiconductor memory device decreases the value of the training information signal VIX_TRAINING_SIG to transmit the training information signal VIX_TRAINING_SIG having the decreased value to the memory controller.

In the foregoing manner, when the training information signal VIX_TRAINING_SIG having the decreased value is transmitted to the memory controller, the second data clock generation unit 170 of the memory controller advances the phase of the second data clock WCK# to generate the second data clock WCK# having the advanced phase.

For enabling the above-described operations to be performed, additionally, the training information signal VIX_TRAINING_SIG should have a predetermined initial value, and the phase shift value of the second data clock WCK# corresponding to the absolute value of the training information signal VIX_TRAINING_SIG should be predetermined in the second data clock generation unit 170.

In the semiconductor memory device of the semiconductor system, the WCK2CK phase detection unit 180 detects the difference in phase between the system clock HCK and the clocks FDIV_WCK and FDIV_WCK# that are outputted from the frequency divider 124 of the data clock input unit 120, and transmits the WCK2CK training information signal WCK2CK_TRAINING_SIG corresponding to the detected phase difference to the memory controller. The WCK2CK phase detection unit 180 is an element for performing the WCK2CK training operation that has been described in the background of the present invention, is a known technology.

In the semiconductor memory device of the semiconductor system, the WCK2CK phase detection unit 180 detects the difference in phase between the first and second data clocks WCK and WCK# and transmits the training information signal VIX_TRAINING_SIG corresponding to the detected phase difference to the memory controller. This training operation is different from typical WCK2CK training operations.

In the semiconductor memory device of the semiconductor system, detailed explanation of the operation of the WCK2CK phase detection unit 180 is omitted.

Furthermore, the training operation in accordance with the first embodiment of the present invention may be called a crossing-point training operation.

Moreover, as illustrated in FIG. 1, a crossing-point training information signal VIX_TRAINING_SIG which is generated through the crossing-point training operation in accordance with the first embodiment of the present invention and the WCK2CK training information signal WCK2CK_TRAINING_SIG which is generated through the known WCK2CK training operation may be transmitted to the memory controller through the same pad (i.e., a pin), in the semiconductor memory device. For such a pad, an EDC pad (i.e., a pin) may be used, which is included in the semiconductor memory device, independently from a pad (i.e., a pin) through which the data signal DATA is inputted/outputted or the address signal ADDR and the command signal CMD are inputted/outputted.

In accordance with the first embodiment of the present invention, as described above, the memory system detects the phase difference between the first and second data clocks WCK and WCK# that are differentially inputted to the high-speed semiconductor memory device and independently from the system clock HCK, and performs crossing-point training (i.e., vix training) for controlling the phase of the second data clock WCK# by a phase corresponding to the detected phase difference. Accordingly, the differential first and second data clocks WCK and WCK# as inputted to the high-speed semiconductor memory device can have opposite phases with respect to each other.

Consequently, the duty ratio of the data signal DATA, which is inputted/outputted corresponding to the first and second data clocks WCK and WCK#, is 50:50 accurately.

Moreover, the setup/hold time of the data signal DATA, which is inputted/outputted corresponding to the first and second data clocks WCK and WCK#, is secured to be sufficient.

Second Embodiment

Figure 2:
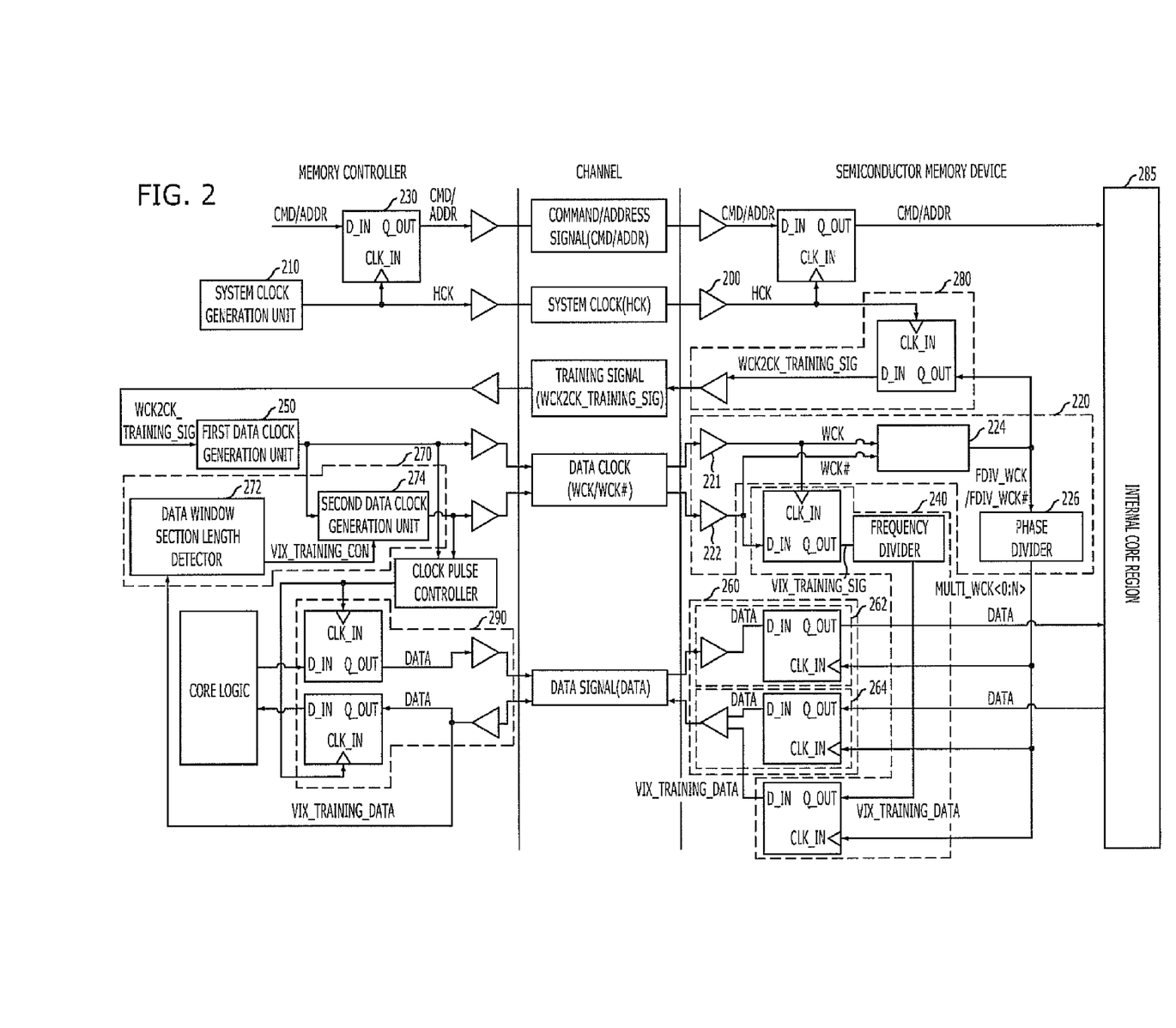
FIG. 2 is a block diagram illustrating a semiconductor system in accordance with a second embodiment of the present invention.

FIG. 2 is a block diagram illustrating a semiconductor system in accordance with a second embodiment of the present invention.

Referring to FIG. 2, a semiconductor system in accordance with a second embodiment of the present invention includes a memory controller and a semiconductor memory device. The memory controller generates and outputs a system clock HCK (which corresponds to an address signal ADDR and a command signal CMD) and first and second data clocks WCK and WCK# which correspond to a data signal DATA, wherein the second data clock WCK# as received by the data clock input unit is intended to be an inverse of the first data clock WCK, and the memory controller shifts the phase of the second data clock WCK# to generate the second data clock WCK# having the shifted phase according to the data window section length rate of a training information data VIX_TRAINING_DATA. By receiving the address signal ADDR and the command signal CMD based on the system clock HCK and inputting/outputting the data signal DATA based on the first and second data clocks WCK and WCK#, the semiconductor memory device performs a predetermined internal operation. The semiconductor memory device determines each data window section of a predetermined pattern data for each edge of the first and second data clocks WCK and WCK# to output the training information data VIX_TRAINING_DATA, at a training operation mode.

The memory controller includes a system clock generation unit 210, an address/command signal output unit 230, a first data clock generation unit 250, a second data clock generation unit 270, and a data signal input/output unit 290. The system clock generation unit 210 generates the system clock HCK. The address/command signal output unit 230 outputs the address signal ADDR and the command signal CMD based on the system clock HCK. The first data clock generation unit 250 generates the first data clock WCK having a phase which is a shifted according to a WCK2CK training information signal WCK2CK_TRAINING_SIG. The second data clock generation unit 270 shifts the phase of a clock, in which the phase of the first data clock WCK is inverted, to output the phase-shifted clock as the second data clock WCK# according to the data window section length rate of the training information data VIX_TRAINING_DATA. The data signal input/output unit 290 inputs/outputs the data signal DATA based on the first and second data clocks WCK and WCK#.

The second data clock generation unit 270 of the memory controller includes a data window section time span detector 272 and a second data clock generation unit 274. The data window section length detector 272 detects the data window section length of data corresponding to the reference edge of the first data clock WCK and the data window section length of data corresponding to the reference edge of the second data clock WCK#, among the training information data VIX_TRAINING_DATA. The second data generation unit 274 shifts the phase of a clock, in which the phase of the first data clock WCK is inverted, to output the phase-shifted clock as the second data clock WCK# according to the output signal of the data window section length detector 272.

The semiconductor memory device includes a system clock input unit 210, a data clock input unit 220, and a training information data transmission unit 240. The system clock input unit 210 receives the system clock HCK for synchronizing the input times of the address signal ADDR and the command signal CMD from the memory controller. The data clock input unit 220 receives the first and second data clocks WCK and WCK# for synchronizing the input/output time of the data signal DATA from the memory controller, wherein the second data clock WCK# as received by the data clock input unit is intended to be an inverse of the first data clock WCK, and the phase of the received second data clock WCK# is shifted according to the data window section length rate of the training information data VIX_TRAINING_DATA. The training information data transmission unit 240 determines each data window section of the predetermined pattern data for each edge of the first and second data clocks WCK and WCK# to transmit the training information data VIX_TRAINING_DATA to the memory controller.

Moreover, the data clock input unit 120 of the semiconductor memory device includes data clock input buffers 221 and 222, a frequency divider 224, and a phase divider 226. The data clock input buffers 221 and 222 receive and buffer the first and second data clocks WCK and WCK#, respectively. The frequency divider 224 divides the frequencies of the first and second data clocks WCK and WCK# that are outputted from the data clock input buffers 121 and 122 to output clocks FDIV_WCK and FDIV_WCK# having the same frequency as that of the system clock HCK. The phase divider 226 divides the phases of the clocks FDIV_WCK and FDIV_WCK# that are outputted from the frequency divider 124 to generate a plurality of multi system clocks MULTI_WCK <0:N> having a predetermined phase difference.

The semiconductor memory device further includes a WCK2CK phase detection unit 280. The WCK2CK phase detection unit 280 detects the logic levels of the clocks FDIV_WCK and FDIV_WCK# that are outputted from the frequency divider 224 of the data clock input unit 220 based on the edge of the system clock HCK, generates the WCK2CK training information signal WCK2CK_TRAINING_SIG according to the detected logic levels, and transmits the generated signal to the memory controller.

Moreover, the semiconductor memory device further includes a data input/output buffer unit 260. The data input/output buffer unit 260 aligns the data signal DATA based on the multi system clocks MULTI_WCK <0:N> and receives/outputs the data signal DATA from/to the memory controller.

The data input/output buffer unit 260 includes a data input buffer 262 and a data output buffer 264. The data input buffer 262 aligns the data signal DATA that is inputted from the memory controller to the semiconductor memory device based on the multi system clocks MULTI_WCK <0:N> and transmits the aligned signal to an internal core region 285. The data output buffer 164 aligns the data signal DATA that is outputted from the internal core region 285 based on the multi system clocks MULTI_WCK <0:N> and transmits the aligned signal to the memory controller.

Additionally, an operation that aligns the data signal DATA based on the multi system clocks MULTI_WCK <0:N> to transmit the aligned signal is a known operation and can be easily understood without further details being provided. Thus, description of such an operation is unnecessary and, therefore, is omitted.

The following description will be made on the operation of the semiconductor system in accordance with the second embodiment of the present invention, based on the above-described configuration.

First, the frequencies of the first and second data clocks WCK and WCK#, which are transferred from the memory controller to the semiconductor memory device, are higher than the frequency of the system clock HCK. Moreover, the frequency of the data signal DATA, which is inputted/outputted to/from the memory controller and the semiconductor memory device, is higher than the frequencies of the first and second data clocks WCK and WCK#.

For example, when the frequency of the system clock HCK is 1 GHz, the frequencies of the first and second data clocks WCK and WCK# are 2 GHz that is two times higher than the frequency of the system clock HCK, and the frequency of the data signal DATA is 4 GHz that is two times higher than the frequencies of the first and second data clocks WCK and WCK#.

Figure 4A:
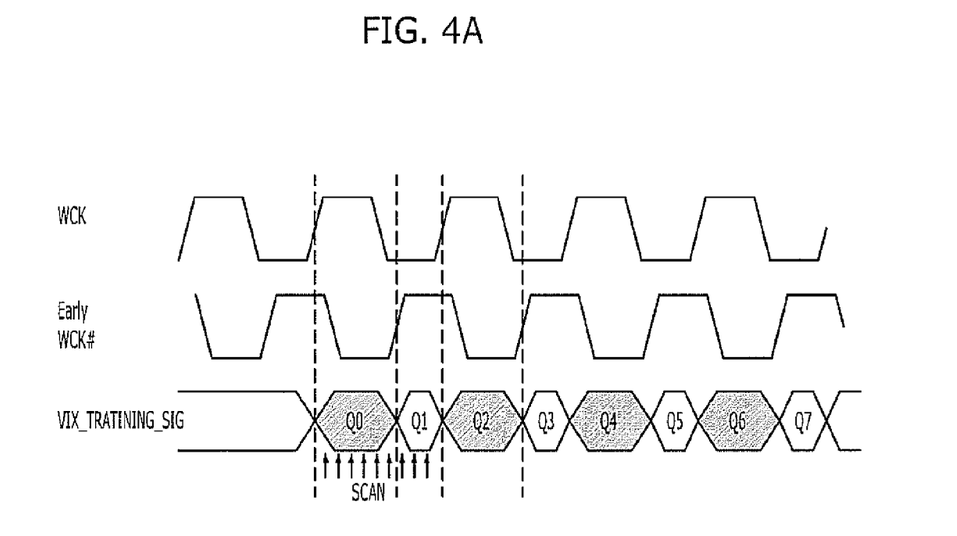
FIG. 4A is a timing diagram illustrating a case where the phase of a second data clock leads that of a first data clock in the operation of the semiconductor system of FIG. 2.

The training information data transmission unit 240 of the semiconductor memory device, as shown in FIG. 4*a*, aligns a predetermined pattern data PATTERN_DATA based on the first and second data clocks WCK and WCK# to transmit the training information data VIX_TRAINING_DATA to the memory controller. At this point, aligning the predetermined pattern data PATTERN_DATA based on the first and second data clocks WCK and WCK# means that the data window length of the predetermined pattern data PATTERN_DATA is determined at the reference edge of the first data clock WCK and the reference edge of the second data clock WCK#.

For example, as shown in FIG. 4A, the even-numbered data "Q0, Q2, Q4, Q6, . . . " of the predetermined pattern data PATTERN_DATA are synchronized with the rising edge of the first data clock WCK, and the odd-numbered data "Q1, Q3, Q5, Q7, . . . " of the predetermined pattern data PATTERN_DATA are synchronized with the rising edge of the second data clock WCK#.

In FIG. 4A, the phase of the second data clock WCK# leads that of the first data clock WCK. Accordingly, the even-numbered data "Q0, Q2, Q4, Q6, . . . " of the predetermined pattern data PATTERN_DATA which are synchronized with the rising edge of the first data clock WCK have the data window having a relatively long length, and the odd-numbered data "Q1, Q3, Q5, Q7, . . . " of the predetermined pattern data PATTERN_DATA which are synchronized with the rising edge of the second data clock WCK# have the data window having a relatively short length.

In the foregoing manner, if the even-numbered data "Q0, Q2, Q4, Q6, . . . " of the predetermined pattern data PATTERN_DATA corresponding to the first data clock WCK have a longer data window in length than the odd-numbered data "Q1, Q3, Q5, Q7, . . . " of the predetermined pattern data PATTERN_DATA corresponding to the second data clock WCK#, it is determined that the phase of the second data clock WCK# leads that of the first data clock WCK. Accordingly, the phase of the second data clock WCK# should be delayed. However, since the first and second data clocks WCK and WCK# are not generated in the semiconductor memory device, the even-numbered data "Q0, Q2, Q4, Q6, . . . " of the predetermined pattern data PATTERN_DATA have a relatively long length in correspondence with the first data clock WCK, and the odd-numbered data "Q1, Q3, Q5, Q7, . . . " of the predetermined pattern data PATTERN_DATA have a data window with a relatively short length in correspondence with the second data clock WCK#, in the semiconductor memory device. Subsequently, the semiconductor memory device merely transmits the pattern data PATTERN_DATA as the training information data VIX_TRAINING_DATA to the memory controller.

That is, an operation of slowing the phase of the second data clock WCK# is performed in response to that in which the memory controller receives the training information data VIX_TRAINING_DATA and detects that in which the even-numbered data "Q0, Q2, Q4, Q6, . . . " have a longer data window length than the odd-numbered data "$Q^1$, $Q^3$, $Q^5$, $Q^7$, . . . ".

Specifically, the data window section length detector 272 of the second data clock generation unit 270 among the elements of the memory controller uses a method that scans the logic level of the training information data VIX_TRAINING_DATA at predetermined periods for measuring the data window section length/time span of the data of the training information data VIX_TRAINING_DATA corresponding to the reference edge of the first data clock WCK, i.e., the even-numbered data "Q0, Q2, Q4, Q6, . . . " of the predetermined pattern data PATTERN_DATA corresponding to the rising edge of the first data clock WCK and the data window section length of the data of the training information data VIX_TRAINING_DATA corresponding to the reference edge of the second data clock WCK#, i.e., the odd-numbered data "Q1, Q3, Q5, Q7, . . . " of the predetermined pattern data PATTERN_DATA corresponding to the rising edge of the second data clock WCK#.

That is, since the pattern of the pattern data PATTERN_DATA (which are transmitted as the training information data VIX_TRAINING_DATA to the memory controller) has a type in which 0 and 1 are alternately repeated, as shown in FIG. 4A, by scanning the two continued data Q0 and Q1 of the training information data VIX_TRAINING_DATA at predetermined periods, it can be easily seen that the length of the data window of the fore data Q0 is longer than that of the hind data Q1.

If the pattern data PATTERN_DATA (which are transmitted as the training information data VIX_TRAINING_DATA to the memory controller) is "01010101 . . . ", as shown in FIG. 4A, the even-numbered data "Q0, Q2, Q4, Q6, . . . " having a value of 0 among scan-result values that are obtained by scanning the data window length of the pattern data PATTERN_DATA are detected six times and the odd-numbered data "Q1, Q3, Q5, Q7, . . . " having a value of 1 among the scan-result values are detected three times. Consequently, it can be easily seen that the data window length of the even-numbered data "Q0, Q2, Q4, Q6, . . . " is longer than that of the odd-numbered data "Q1, Q3, Q5, Q7, . . . ".

As shown in FIG. 4A, it cannot be convinced through only an operation of scanning the two continued data Q0 and Q1 once that the data window length of the even-numbered data "Q0, Q2, Q4, Q6, . . . " is longer than that of the odd-numbered data "Q1, Q3, Q5, Q7, . . . ". For improving the accuracy of the scan result, therefore, a method should be used which continuously scans the two continued data "Q0 and Q1/Q2 and Q3/Q4 and Q5/Q6 and Q7/ . . . " by the number of predetermined times.

In the data window section length detector 272 of the second data clock generation unit 270 among the elements of the memory controller, as shown in FIG. 4A, the even-numbered data "Q0, Q2, Q4, Q6, . . . " having a value of 0 among scan-result values that are obtained by scanning the data window length of the pattern data PATTERN_DATA (which are transmitted as the training information data VIX_TRAINING_DATA to the memory controller) are detected six times, and the odd-numbered data "Q1, Q3, Q5, Q7, . . . " having a value of 1 among the scan-result values are detected three times. In this case, because it is determined that the phase of the second data clock WCK# leads that of the first data clock WCK, the data window section length detector 272 outputs a window section length detection signal VIX_TRAINING_CON having a logic high level.

In the foregoing manner, when the data window section length detection signal VIX_TRAINING_CON having a logic high level is transmitted to the second data clock generation unit 274, the second data clock generation unit 274 delays the phase of the second data clock WCK# to output the second data clock WCK# having the delayed phase.

In addition, the first and second data clocks WCK and WCK# as received by the data clock input unit are signals intended to be inverse of each other in phase. The first data clock generation unit 250 generates the first data clock WCK, which is used to generate the second data clock WCK#. In delaying the phase of the second data clock WCK#, therefore, the second data clock generation unit 274 of the second data clock generation unit 270 outputs a clock having a phase, which lags behind the phase of a clock, in which the phase of the first data clock WCK is inverted, as the second data clock WCK# in response to the data window section length detection signal VIX_TRAINING_CON having a logic high level.

Figure 4B:
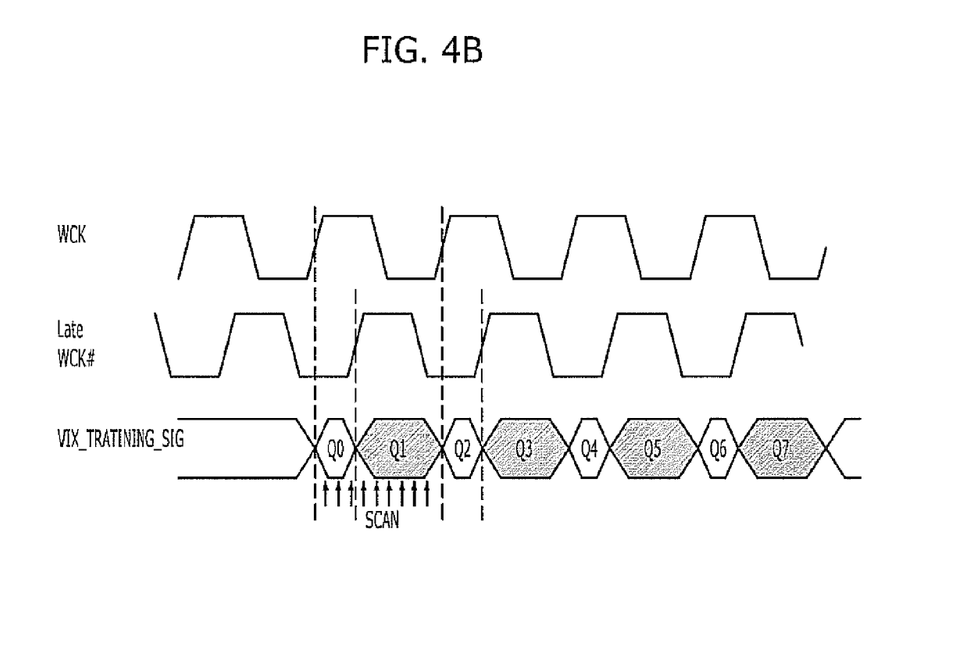
FIG. 4B is a timing diagram illustrating a case where the phase of a second data clock lags behind that of a first data clock in the operation of the semiconductor system of FIG. 2.
Figure 5:
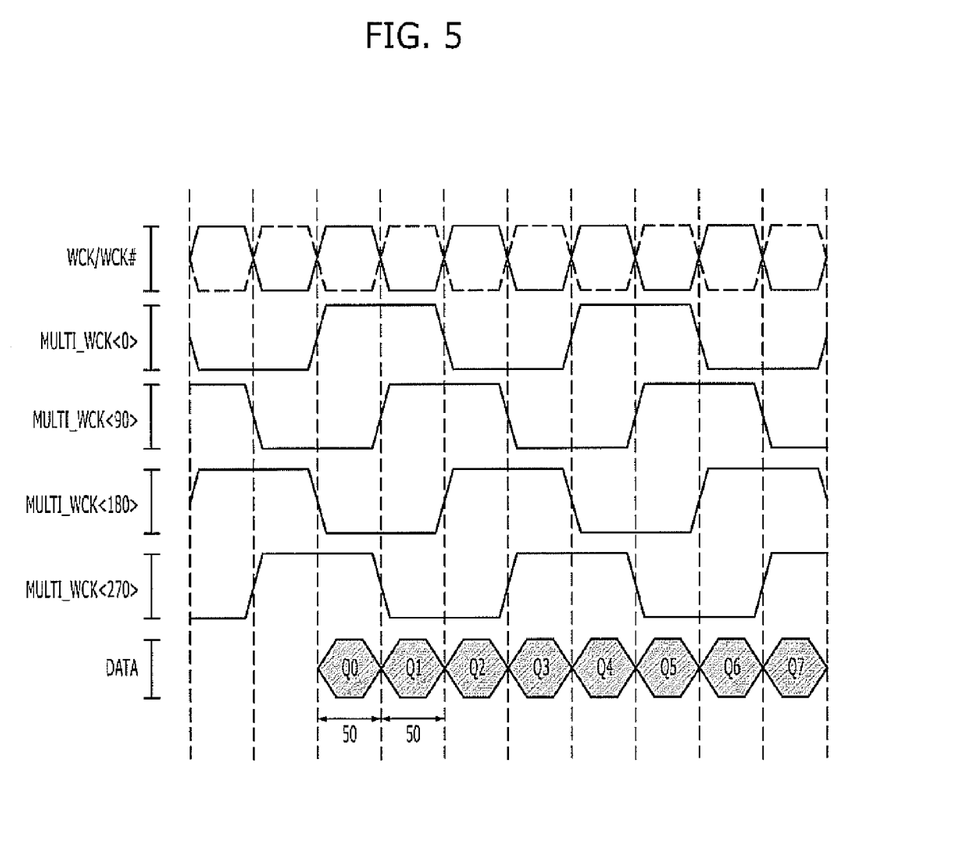
FIG. 5 is a timing diagram illustrating the alignment of a data signal based on a plurality of multi system clocks which are generated corresponding to the first and second data clocks.

In FIG. 4B, on the other hand, the phase of the second data clock WCK# lags behind that of the first data clock WCK. Accordingly, the even-numbered data "Q0, Q2, Q4, Q6, ..." of the predetermined pattern data PATTERN_DATA which are synchronized with the rising edge of the first data clock WCK have the data window having a relatively short length, and the odd-numbered data "Q1, Q3, Q5, Q7, ..." of the predetermined pattern data PATTERN_DATA which are synchronized with the rising edge of the second data clock WCK# have the data window having a relatively long length.

In the foregoing manner, if the even-numbered data "Q0, Q2, Q4, Q6, ..." of the predetermined pattern data PATTERN_DATA corresponding to the first data clock WCK have a shorter data window in length than the odd-numbered data "Q1, Q3, Q5, Q7, ..." of the predetermined pattern data PATTERN_DATA corresponding to the second data clock WCK#, it is determined that the phase of the second data clock WCK# lags behind that of the first data clock WCK. Accordingly, the phase of the second data clock WCK# should be advanced. However, since the first and second data clocks WCK and WCK# are not generated in the semiconductor memory device, the even-numbered data "Q0, Q2, Q4, Q6, ..." of the predetermined pattern data PATTERN_DATA have a relatively short length in correspondence with the first data clock WCK, and the odd-numbered data "Q1, Q3, Q5, Q7, ..." of the predetermined pattern data PATTERN_DATA have a relatively long length in correspondence with the second data clock WCK#, in the semiconductor memory device. Subsequently, the semiconductor memory device merely transmits the pattern data PATTERN_DATA as the training information data VIX_TRAINING_DATA to the memory controller.

That is, an operation of advancing the phase of the second data clock WCK# is performed in response to that in which the memory controller receives the training information data VIX_TRAINING_DATA and detects that in which the even-numbered data "Q0, Q2, Q4, Q6, ..." have a shorter data window length than the odd-numbered data "Q1, Q3, Q5, Q7, ...".

Specifically, the data window section length detector 272 of the second data clock generation unit 270 among the elements of the memory controller uses a method that scans the logic level of the training information data VIX_TRAINING_DATA at predetermined periods for measuring the data window section length of the data of the training information data VIX_TRAINING_DATA corresponding to the reference edge of the first data clock WCK, i.e., the even-numbered data "Q0, Q2, Q4, Q6, ..." of the predetermined pattern data PATTERN_DATA corresponding to the rising edge of the first data clock WCK and the data window section length of the data of the training information data VIX_TRAINING_DATA corresponding to the reference edge of the second data clock WCK#, i.e., the odd-numbered data "Q1, Q3, Q5, Q7, ..." of the predetermined pattern data PATTERN_DATA corresponding to the rising edge of the second data clock WCK#.

That is, since the pattern of the pattern data PATTERN_DATA (which are transmitted as the training information data VIX_TRAINING_DATA to the memory controller) has a type in which 0 and 1 are alternately repeated, as shown in FIG. 4B, by scanning the two continued data Q0 and Q1 of the training information data VIX_TRAINING_DATA at predetermined periods, it can be easily seen that the length of the fore data Q0 is longer than that of the hind data Q1.

If the pattern data PATTERN_DATA (which are transmitted as the training information data VIX_TRAINING_DATA to the memory controller) is "10101010 ... ", as shown in FIG. 4B, the even-numbered data "Q0, Q2, Q4, Q6, ..." having a value of 1 among scan-result values that are obtained by scanning the data window length of the pattern data PATTERN_DATA are detected three times and the odd-numbered data "Q1, Q3, Q5, Q7, ..." having a value of 0 among the scan-result values are detected six times. Consequently, it can be easily seen that the data window length of the even-numbered data "Q0, Q2, Q4, Q6, ..." is shorter than that of the odd-numbered data "Q1, Q3, Q5, Q7, ...".

As shown in FIG. 4B, it cannot be convinced through only an operation of scanning the two continued data Q0 and Q1 once that the data window length of the even-numbered data "Q0, Q2, Q4, Q6, ..." is shorter than that of the odd-numbered data "Q1, Q3, Q5, Q7, ...". For improving the accuracy of the scan result, therefore, a method should be used which continuously scans the two continued data "Q0 and Q1/Q2 and Q3/Q4 and Q5/Q6 and Q7/ ..." by the number of predetermined times.

In the data window section length detector 272 of the second data clock generation unit 270 among the elements of the memory controller, as shown in FIG. 4B, the even-numbered data "Q0, Q2, Q4, Q6, ..." having a value of 1 among scan-result values that are obtained by scanning the data window length of the pattern data PATTERN_DATA (which are transmitted as the training information data VIX_TRAINING_DATA to the memory controller) are detected three times, and the odd-numbered data "Q1, Q3, Q5, Q7, ..." having a value of 0 among the scan-result values are detected six times. In this case, because it is determined that the phase of the second data clock WCK# lags behind that of the first data clock WCK, the data window section length detector 272 outputs a window section length detection signal VIX_TRAINING_CON having a logic low level.

In the foregoing manner, when the data window section length detection signal VIX_TRAINING_CON having a logic low level is transmitted to the second data clock generation unit 274, the second data clock generation unit 274 advances the phase of the second data clock WCK# to output the second data clock WCK# having the advanced phase.

In addition, the first and second data clocks WCK and WCK# are signals intended to be inverse of each other in phase. The first data clock generation unit 250 generates the first data clock WCK, and inverts the phase of the first data clock WCK to generate the second data clock WCK#. For advancing the phase of the second data clock WCK#, therefore, the second data clock generation unit 274 of the second data clock generation unit 270 outputs a clock having a phase, which leads the phase of a clock, in which the phase of the first data clock WCK is inverted, as the second data clock WCK# in response to the data window section length detection signal VIX_TRAINING_CON having a logic high level.

As described above, the training information data output unit 240 of the semiconductor memory device determines the data window length of the even-numbered data "Q0, Q2, Q4, Q6, ..." of the pattern data PATTERN_DATA in correspondence with the reference edge of the first data clock WCK and determines the data window length of the odd-numbered data "Q1, Q3, Q5, Q7, ..." of the pattern data PATTERN_DATA in correspondence with the reference edge of the second data clock WCK#. Subsequently, when the training information data output unit 240 transmits the pattern data PATTERN_

DATA as the training information data VIX_TRAINING_DATA to the memory controller, the second data clock generation unit 270 of the memory controller among the elements of the semiconductor system shifts the phase of the second data clock WCK# to generate the second data clock WCK# having the shifted phase, and thus the first and second data clocks WCK and WCK# that are used in the semiconductor memory device have opposite phases with respect to each other.

In the second embodiment of the present invention, additionally, because the data window section length detection signal VIX_TRAINING_CON having a value (which is directly determined corresponding to the detection result of each data window length of the training information data VIX_TRAINING_DATA) is composed of one bit, it has a logic high level or a logic low level. This is merely one embodiment, and thus the data window section length detection signal VIX_TRAINING_CON may be composed of a plurality of bits. That is, among the elements of the semiconductor system, the second data clock generation unit 270 of the memory controller may operate as follows.

As in FIG. 4A, when the phase of the second data clock WCK# leads the phase of the first data clock WCK, the data window section length detector 272 of the second data clock generation unit 270 increases the value of the data window section length detection signal VIX_TRAINING_CON to output the data window section length detection signal VIX_TRAINING_CON having the increased value.

In the foregoing manner, when the value of the data window section length detection signal VIX_TRAINING_CON increases, the second data clock generation unit 274 of the second data clock generation unit 270 delays the phase of the second data clock WCK# by the increment of the value of the data window section time span detection signal VIX_TRAINING_CON to generate the second data clock WCK# having the delayed phase.

Likewise, as shown in FIG. 4B, when the phase of the second data clock WCK# lags behind the phase of the first data clock WCK, the data window section length detector 272 of the second data clock generation unit 270 decreases the value of the data window section length detection signal VIX_TRAINING_CON to output the data window section length detection signal VIX_TRAINING_CON having the decreased value.

In the foregoing manner, when the value of the data window section length detection signal VIX_TRAINING_CON decreases, the second data clock generation unit 274 of the second data clock generation unit 270 advances the phase of the second data clock WCK# by the decrement of the value of the data window section length detection signal VIX_TRAINING_CON to generate the second data clock WCK# having the advanced phase.

For enabling the above-described operations to be performed, additionally, the data window section length detection signal VIX_TRAINING_CON should have a predetermined initial value, and the phase shift value of the second data clock WCK# corresponding to the absolute value of the data window section length detection signal VIX_TRAINING_CON should be predetermined in the second data clock generation unit 274.

In the semiconductor memory device of the semiconductor system, the WCK2CK phase detection unit 280 detects the difference in phase between the system clock HCK and the clocks FDIV_WCK and FDIV_WCK# that are outputted from the frequency divider 224 of the data clock input unit 220, and transmits the WCK2CK training information signal WCK2CK_TRAINING_SIG corresponding to the detected phase difference to the memory controller. This represents an element for performing the WCK2CK training operation that has been described in the background of the present invention, is a known technology, and is not directly related to a training operation in accordance with the second embodiment of the present invention.

In the semiconductor memory device of the semiconductor system, the WCK2CK phase detection unit 280 detects the difference in phase between the first and second data clocks WCK and WCK# and transmits the training information signal VIX_TRAINING_SIG corresponding to the detected phase difference to the memory controller. This training operation is not associated with the known WCK2CK training operation at all.

In the semiconductor memory device of the semiconductor system, the operation of the WCK2CK phase detection unit 280 is omitted.

Furthermore, the training operation in accordance with the embodiment of the present invention may be called a crossing-point training operation, unlike the known WCK2CK training operation.

Moreover, as illustrated in FIG. 2, the crossing-point training information data VIX_TRAINING_DATA which is generated through the crossing-point training operation in accordance with the second embodiment of the present invention may be transmitted from the semiconductor memory device to the memory controller through a pad (i.e., a pin) through which the data signal DATA is outputted. That is, the crossing-point training information data VIX_TRAINING_DATA may be transmitted through the pad (i.e., a pin) that differs from a pad (i.e., a pin) through which the WCK2CK training information signal WCK2CK_TRAINING_SIG (which is generated through the known WCK2CK training operation) is transmitted from the semiconductor memory device to the memory controller.

In accordance with the second embodiment of the present invention, as described above, the memory system detects the phase difference between the first and second data clocks WCK and WCK# that are differentially inputted to the high-speed semiconductor memory device and independently from the system clock HCK, and performs crossing-point training (i.e., vix training) for controlling the phase of the second data clock WCK# by a phase corresponding to the detected phase difference. Accordingly, the differential type of first and second data clocks WCK and WCK# which are inputted to the high-speed semiconductor memory device can have opposite phases with respect to each other.

Consequently, the duty ratio of the data signal DATA, which is inputted/outputted corresponding to the first and second data clocks WCK and WCK#, is 50:50 accurately.

Moreover, the setup/hold time of the data signal DATA, which is inputted/outputted corresponding to the first and second data clocks WCK and WCK#, is secured enough.

In accordance with the embodiments of the present invention, the semiconductor memory device and the semiconductor system detect the phase difference between the data clocks that are inputted to the semiconductor memory device differentially, and perform crossing-point training for controlling the phases of the data clocks by a phase corresponding to the detected phase difference. Accordingly, the data clocks, which are inputted to the semiconductor memory device differentially, have opposite phases with respect to each other.

Consequently, the duty ratio of a data signal that is inputted/outputted corresponding to the data clocks is 50:50 accurately.

Moreover, the setup/hold time of the data signal that is inputted/outputted corresponding to the data clocks is secured enough.

While the present invention has been described with respect to the specific embodiments, it will be apparent to those skilled in the art that various changes and modifications may be made without departing from the spirit and scope of the invention as defined in the following claims.

What is claimed is:

1. A semiconductor system, comprising:
a memory controller configured to generate and output a system clock corresponding to an address signal and a command signal, and first and second data clocks corresponding to a data signal, wherein the second data clock as received by the data clock input unit is intended to be an inverse of the first data clock, the memory controller shifts a phase of the second data clock to generate the second data clock having the shifted phase according to a training information signal; and
a semiconductor memory device configured to receive the address signal and the command signal based on the system clock and input/output the data signal based on the first and second data clocks to perform a predetermined internal operation, detect a logic level of the second data clock based on a phase of the first data clock, and generate and output the training information signal according to the detected logic level at a training operation mode.

2. The semiconductor system of claim 1, wherein the memory controller comprises:
a system clock generation unit configured to generate the system clock;
an address/command signal output unit configured to output the address signal and the command signal based on the system clock;
a first data clock generation unit configured to generate the first data clock;
a second data clock generation unit configured to shift a phase of a clock, in which a phase of the first data clock is inverted, to output the phase-shifted clock as the second data clock according to the training information signal; and
a data signal input/output unit configured to input/output the data signal based on the first and second data clocks.

3. The semiconductor system of claim 2, wherein the semiconductor memory device comprises:
a system clock input unit configured to receive the system clock;
a data clock input unit configured to receive the first and second data clocks; and
a phase detection unit configured to detect a logic level of the second data clock based on an edge of the first data clock, and generate and output the training information signal to transmit the generated signal according to the detected logic level.

4. The semiconductor system of claim 3, wherein:
when a logic level of the second data clock is a logic low level at a reference edge of the first data clock, the phase detection unit determines that a phase of the second data clock leads a phase of the first data clock, and generates and outputs the training information signal having a logic high level, and
when a logic level of the second data clock is a logic high level at the reference edge of the first data clock, the phase detection unit determines that the phase of the second data clock lags behind the phase of the first data clock, and generates and outputs the training information signal having a logic low level.

5. The semiconductor system of claim 4, wherein:
the second data clock generation unit generates the second data clock which lags behind the phase of the clock in which a phase of the first data clock is inverted, in response to the training information signal having a logic high level, and
the second data clock generation unit generates the second data clock which leads the phase of the clock in which a phase of the first data clock is inverted, in response to the training information signal having a logic low level.

6. The semiconductor system of claim 3, wherein:
when a logic level of the second data clock is a logic low level at a reference edge of the first data clock, the phase detection unit determines that a phase of the second data clock leads a phase of the first data clock, and increases a value of the training information signal to output the training information signal having the increased value, and
when a logic level of the second data clock is a logic high level at the reference edge of the first data clock, the phase detection unit determines that the phase of the second data clock lags behind the phase of the first data clock, and decreases the value of the training information signal to output the training information signal having the decreased value.

7. The semiconductor system of claim 6, wherein:
the second data clock generation unit delays the phase of the clock, in which the phase of the first data clock is inverted, by the increment of the value of the training information signal to output the clock having the delayed phase as the second data clock, and
the second data clock generation unit advances the phase of the clock, in which the phase of the first data clock is inverted, by the decrement of the value of the training information signal to output the clock having the advanced phase as the second data clock.

* * * * *